United States Patent
Pakr et al.

(10) Patent No.: US 11,402,340 B2
(45) Date of Patent: Aug. 2, 2022

(54) METHOD FOR DETECTING DEFECT IN INSULATING MATERIAL

(71) Applicant: Hyundai Electric & Energy Systems Co., Ltd., Seoul (KR)

(72) Inventors: Joo-Eon Pakr, Seoul (KR); Byoung-Woon Min, Seoul (KR)

(73) Assignee: Hyundai Electric & Energy Systems Co., Ltd., Seoul (KR)

( * ) Notice: Subject to any disclaimer, the term of this patent is extended or adjusted under 35 U.S.C. 154(b) by 214 days.

(21) Appl. No.: 16/606,729

(22) PCT Filed: Apr. 20, 2018

(86) PCT No.: PCT/KR2018/004634
§ 371 (c)(1),
(2) Date: Oct. 18, 2019

(87) PCT Pub. No.: WO2018/194422
PCT Pub. Date: Oct. 25, 2018

(65) Prior Publication Data
US 2020/0057009 A1    Feb. 20, 2020

(30) Foreign Application Priority Data

Apr. 20, 2017  (KR) .................. 10-2017-0051200
Jun. 21, 2017  (KR) .................. 10-2017-0078719
(Continued)

(51) Int. Cl.
*G01N 23/18*     (2018.01)
*G01N 23/083*    (2018.01)
*G01N 23/10*     (2018.01)

(52) U.S. Cl.
CPC ........... *G01N 23/18* (2013.01); *G01N 23/083* (2013.01); *G01N 23/10* (2013.01); *G01N 2223/646* (2013.01)

(58) Field of Classification Search
CPC ...... G01N 23/18; G01N 23/083; G01N 23/10; G01N 2223/646
(Continued)

(56) References Cited

U.S. PATENT DOCUMENTS

2005/0134290 A1 * 6/2005 Sarkozi .................. H01F 38/30
                                                324/543
2008/0217297 A1   9/2008 Kanazawa et al.
(Continued)

FOREIGN PATENT DOCUMENTS

CN       101655537 A     2/2010
CN       104115355 A    10/2014
(Continued)

OTHER PUBLICATIONS

Second Notification of Office Action dated May 23, 2022 in Chinese Application No. CN 20188026078.7.
Z Liu et al., "Study of Dielectric Properties and the Microstructure Impace of Cured Epoxy Resin by X-Ray Radiation", Science Technology and Engineering, 15(4), Feb. 2015 (Abstract only).

*Primary Examiner* — Hugh Maupin
(74) *Attorney, Agent, or Firm* — Fox Rothschild LLP

(57) ABSTRACT

A device for detecting a defect in an insulating material to be measured, may include a case having a test chamber in which the insulating material is accommodated; a withstand voltage tester applying a voltage to the insulating material accommodated in the test chamber; a plurality of X-ray modules disposed in the test chamber and irradiating X-rays toward different regions or in different directions; and a partial discharge sensor measuring a partial discharge generated from the insulating material accommodated in the test chamber.

4 Claims, 11 Drawing Sheets

(30) Foreign Application Priority Data

Jun. 21, 2017 (KR) .................. 10-2017-0078720
Jun. 21, 2017 (KR) .................. 10-2017-0078721

(58) Field of Classification Search
USPC ........................................... 378/58
See application file for complete search history.

(56) References Cited

U.S. PATENT DOCUMENTS

| | | |
|---|---|---|
| 2010/0045305 A1 | 2/2010 | Fuhrmann et al. |
| 2010/0123464 A1* | 5/2010 | Park ............... G01R 31/1227 324/500 |
| 2015/0204936 A1 | 7/2015 | Fukasawa et al. |
| 2016/0282403 A1 | 9/2016 | Hanawa |

FOREIGN PATENT DOCUMENTS

| | | |
|---|---|---|
| CN | 204347192 U | 5/2015 |
| CN | 206020592 U | 3/2017 |
| JP | S61189446 A | 8/1986 |
| JP | H11146541 A | 5/1999 |
| JP | 2007-232496 A | 9/2007 |
| JP | 2008-098011 A | 9/2008 |
| JP | 2010-281785 A | 12/2010 |
| JP | 2011-209266 A | 10/2011 |
| JP | 2012-127687 A | 7/2012 |
| JP | 2013047418 A | 3/2013 |
| JP | 2016-180629 A | 10/2016 |
| KR | 10-1998-0066157 A | 10/1998 |
| KR | 10-2013-0047418 A | 5/2013 |
| KR | 10-1499638 B1 | 3/2015 |

* cited by examiner

METHOD FOR DETECTING DEFECT IN INSULATING MATERIAL

This application is a 35 U.S.C. § 371 U.S. national entry of International Application PCT/KR2018/004634, having an International filing date of Apr. 20, 2018, which claims under 35 U.S.C. § 119 the benefit of Korean Patent Application 10-2017-0078719 filed on Jun. 21, 2017; Korean Patent Application 10-2017-0078720 filed on Jun. 21, 2017; Korean Patent Application 10-2017-0078721 filed on Jun. 21, 2017; and Korean Patent Application 10-2017-0051200 filed on Apr. 20, 2017. The entire contents of these applications are incorporated herein by reference in their entirety.

TECHNICAL FIELD

The present disclosure relates to a device for detecting a defect in an insulating material, a jig of the device for fixing an insulating material to be measured, and a method for detecting a defect in an insulating material.

BACKGROUND ART

Epoxy-based insulating materials for the purpose of supporting various kinds of conductors may be applied to the gas-insulated switchgear (GIS).

Since the insulating materials applied to the gas-insulated switchgear may be used in a relatively high voltage environment, a relatively high withstand voltage performance may be required, and stable insulation performance may be required, even in the relatively high voltage environment.

However, if there is avoid in the insulating material, ionization of gas existing in the void may occur with time, and partial discharge may be further generated due to the ionization of gas.

If the partial discharge is continuously generated in the insulating material, a sudden reduction in material properties may be caused, resulting in insulation breakdown of the insulating material. Therefore, it may be necessary to select good products by precise inspection, starting from the manufacturing operation of the insulating material.

Korean Patent Publication No. 10-1998-0066157 discloses a device for measuring partial discharge of an insulating material. The device for measuring partial discharge disclosed in the related prior art simply applies a relatively high voltage power source to an insulating material to be measured, waits until partial discharge occurs, and measures a signal of the partial discharge.

However, the device for measuring partial discharge disclosed in the related prior art has a disadvantage in that it takes a relatively long time to measure a defect because a certain period of time is required to ionize the gas existing in the voids, that is, a discharge delay may occur.

In addition, the device for measuring partial discharge disclosed in the related prior art has a disadvantage in that a relatively large amount of electric power may be consumed during the measurement, because a very high voltage may be required to ionize the gas.

Further, since the device for measuring partial discharge disclosed in the related prior art applies a relatively high voltage to the insulating material in order to ionize the gas existing in the voids of the insulating material, the stress applied to the insulating material may increase due to the relatively high voltage applied to the insulating material during the measurement, thereby reducing the lifespan of the product therefrom.

In addition, the device for measuring partial discharge disclosed in the related prior art has a disadvantage in that measurement reliability may be not high, because the measurement results therefrom depend on environmental noise, the experience of the tester, and the like.

DISCLOSURE

Technical Problem

An aspect of the present disclosure is to solve at least a portion of the problems of the related prior art as described above, and an object of the present disclosure is to reduce time required for measuring a defect in an insulating material, and to reduce a voltage required for measuring the defect.

Further, an object of the present disclosure is to prevent deterioration of properties of an insulating material, to fix the insulating material, in plural, in a batch manner, and to minimize attenuation of X-ray energy applied to the insulating material.

Technical Solution

According to an aspect of the present disclosure, a device for detecting a defect in an insulating material to be measured, includes a case having a test chamber in which the insulating material is accommodated; a withstand voltage tester applying a voltage to the insulating material accommodated in the test chamber; a plurality of X-ray modules disposed in the test chamber and irradiating X-rays toward different regions or in different directions; a partial discharge sensor measuring a partial discharge generated from the insulating material accommodated in the test chamber; and a jig having a pair of flange portions to be fastened to a flange of the insulating material and a through-area existing between the flange portions and facing with the insulating material.

In the device, the plurality of X-ray modules may operate independently of each other.

In the device, the plurality of X-ray modules may include: a plurality of upper X-ray modules arranged in an upper portion of the test chamber in a longitudinal direction of the case and irradiating X-rays in a downward direction; a plurality of leftward X-ray modules arranged in a left portion of the test chamber in a longitudinal direction of the case and irradiating X-rays rightwardly; and a plurality of rightward X-ray modules arranged in a right portion of the test chamber in a longitudinal direction of the case and irradiating X-rays leftwardly.

In the device, the plurality of X-ray modules may further include a front X-ray module provided in a front portion of the test chamber and irradiating X-rays in a rear direction of the test chamber.

In the device, the plurality of X-ray modules may be configured to control a distance between each of the plurality of X-ray modules and the insulating material accommodated in the test chamber.

In the device, the case may be configured to simultaneously accommodate the insulating material, in plural, in the test chamber.

The device may further include a cradle on which the plurality of insulating materials are placed and into or from which the test chamber is inserted or withdrawn.

In the device, the case may include a conductor coupled to the plurality of insulating materials, and an electrode terminal connected to the withstand voltage tester and supplying a voltage generated by the withstand voltage tester to the conductor.

In the device, the partial discharge sensor may include a high frequency current transformer (HFCT) sensor connected to a ground line connected to each of the plurality of insulating materials.

In the device, the partial discharge sensor may include an ultra high frequency (UHF) antenna installed in the case.

In the device, the jig includes: the pair of flange portions to be fastened to a flange of the insulating material; support pipes connected to the pair of flange portions and supporting the pair of flange portions to be spaced apart from each other; and a plurality of through-holes formed in the support pipes.

In the device, the jig includes: the pair of flange portions to be fastened to a flange of the insulating material; and a plurality of support rods connected to the pair of flange portions and supporting the pair of flange portions to be spaced apart from each other, both ends of which are rotatably coupled to the flange portions in a circumferential direction of each of the flange portions, wherein the plurality of support rods may be provided at intervals with each other.

In the device, the plurality of through-holes in the support pipe may be formed in a circumferential direction of each of the flange portions.

In the device, the plurality of through-holes may be divided in a longitudinal direction of each of the support pipes or extend in a longitudinal direction of the support pipes.

In the device, each of the pair of flange portions may include a plurality of elongated holes passing through in a direction in which the flange of the insulating material is fastened, and extending in the circumferential direction of each of the pair of flange portions.

The device may further include: a stud bolt passing through and fastened to each of the elongated holes, and fastened to a flange of the insulating material; and a nut fixing the stud bolt to each of the flange portions.

According to an aspect of the present disclosure, a method for detecting a defect in an insulating material to be measured by irradiating an X-ray to the insulating material, using an X-ray module, to induce a gas ionization of voids existing in the insulating material, and measuring a partial discharge generated in the insulating material, includes: a cross-sectional area and thickness measuring operation of measuring a cross-sectional area and a thickness of the insulating material, based on a direction in which the X-ray is irradiated to the insulating material; and an X-ray output controlling operation of controlling an applied voltage and an applied current to an X-ray generating unit of the X-ray module, depending on the cross-sectional area and the thickness of the insulating material.

In the method, the X-ray output controlling operation may include: an applied voltage controlling operation of controlling the applied voltage, depending on the thickness of the insulating material; and an applied current controlling operation of controlling the applied current, depending on the cross-sectional area of the insulating material.

In the method, the applied voltage controlling operation may include an operation of comparing a thickness of the insulating material with a preset reference thickness, setting the applied voltage as a preset high voltage, when the thickness of the insulating material is equal to or greater than the preset reference thickness, and setting the applied voltage as a preset medium level voltage, lower than the preset high voltage, or as a preset low voltage, lower than the preset medium level voltage, when a thickness of the insulating material is less than the preset reference thickness.

In the method, the applied current controlling operation may include an operation of comparing a cross-sectional area of the insulating material with a preset reference area, setting the applied current as a preset large current, when the cross-sectional area of the insulating material is equal to or greater than the preset reference area, and setting the applied current as a preset intermediate current, lower than the preset large current, or as a preset small current, lower than the preset intermediate current, when a cross-sectional area of the insulating material is smaller than the preset reference area.

The method may further include an operation of measuring a spacing distance between the insulating material and the X-ray generating unit, after the cross-sectional area and thickness measuring operation, wherein the X-ray output controlling operation may include an operation of controlling an applied voltage and an applied current to the X-ray generating unit, depending on the spacing distance.

In the method, the X-ray output controlling operation further includes an operation of comparing the spacing distance with a preset reference distance, when a thickness of the insulating material is compared with a preset reference thickness, a cross-sectional area of the insulating material is compared with a preset reference area, the thickness of the insulating material is equal to or greater than the preset reference thickness, and the cross-sectional area of the insulating material is equal to or greater than the preset reference area, wherein, the applied voltage may be set as a preset medium level voltage, and the applied current may be set as a preset intermediate current, when the spacing distance is shorter than the preset reference distance; the applied voltage may be set as the preset medium level voltage, or as a preset high voltage, higher than the preset medium level voltage, and the applied current may be set as the preset intermediate current, or as a preset large current, greater than the preset intermediate current, when the spacing distance is equal to the preset reference distance; and the applied voltage may be set as the preset high voltage, and the applied current may be set as the preset large current, when the spacing distance is longer than the preset reference distance.

In the method, the X-ray output controlling operation may further include an operation of comparing the spacing distance with a preset reference distance, when a thickness of the insulating material is compared with a preset reference thickness, a cross-sectional area of the insulating material is compared with a preset reference area, the thickness of the insulating material is equal to or greater than the preset reference thickness, and the cross-sectional area of the insulating material is smaller than the preset reference area, wherein, the applied voltage may be set as a preset medium level voltage, and the applied current may be set as a preset small current, when the spacing distance is shorter than the preset reference distance; the applied voltage may be set as the preset medium level voltage, or as a preset high voltage, higher than the preset medium level voltage, and the applied current may be set as the preset small current, or as a preset intermediate current, greater than the preset small current, when the spacing distance is equal to the preset reference distance; and the applied voltage may be set as the preset high voltage, and the applied current may be set as the preset large current, greater than the preset intermediate current, when the spacing distance is longer than the preset reference distance.

In the method, the X-ray output controlling operation may further include an operation of comparing the spacing distance with a preset reference distance, when a thickness of the insulating material is compared with a preset reference thickness, a cross-sectional area of the insulating material is compared with a preset reference area, the thickness of the insulating material is less than the preset reference thickness, and the cross-sectional area of the insulating material is smaller than the preset reference area, wherein, the applied voltage may be set as a preset low voltage, and the applied current may be set as a preset small current, when the spacing distance is shorter than the preset reference distance; the applied voltage may be set as the preset medium level voltage, or as a preset medium level voltage, higher than the preset low voltage, and the applied current may be set as the preset small current, or as a preset intermediate current, greater than the preset small current, when the spacing distance is equal to the preset reference distance; and the applied voltage may be set as the preset medium level voltage, and the applied current may be set as the preset intermediate current, or as a preset large current, greater than the preset intermediate current, when the spacing distance is longer than the preset reference distance.

In the method, the X-ray output controlling operation may further include an operation of comparing the spacing distance with a preset reference distance, when a thickness of the insulating material is compared with a preset reference thickness, a cross-sectional area of the insulating material is compared with a preset reference area, the thickness of the insulating material is less than the preset reference thickness, and the cross-sectional area of the insulating material is equal to or greater than the preset reference area, wherein, the applied voltage may be set as a preset low voltage, and the applied current may be set as a preset intermediate current, when the spacing distance is shorter than the preset reference distance; the applied voltage may be set as the preset low voltage, or as a preset medium level voltage, higher than the preset low voltage, and the applied current may be set as the preset intermediate current, or as a preset large current, greater than the preset intermediate current, when the spacing distance is equal to the preset reference distance; and the applied voltage may be set as a preset high voltage, higher than the preset medium level voltage, and the applied current may be set as the preset large current, when the spacing distance is longer than the preset reference distance.

In the method, the spacing distance may be set as be 500 mm to 800 mm.

In the method, the X-ray module may be used, in plural, to irradiate the X-ray to the insulating material, and the number of the plurality of X-ray modules to be operated may be controlled, depending on the cross-sectional area and thickness of the insulating material, and the spacing distance.

Advantageous Effects

According to an aspect of the present disclosure, it is possible to shorten the time for measuring a defect in an insulating material to be measured, reduce an amount of power to be consumed, and minimize damage to the insulating material.

Further, according to another aspect of the present disclosure, a lifespan of the insulating material and reliability of inspection may be improved, and production efficiency and mass productivity of a product therefrom may be improved.

BEST MODE FOR INVENTION

The terminology used herein is for describing particular embodiments only, and is not to be used to limit the present disclosure. Further, the singular forms, such as the forms starting with the articles "a," "an," and "the" are intended to include the plural forms as well, unless the context clearly indicates otherwise.

Various embodiments of the present disclosure will now be described with reference to the accompanying drawings.

First, with reference to FIG. 1, a device 100 for detecting a defect in an insulating material according to an embodiment of the present disclosure will be described.

Figure 1:
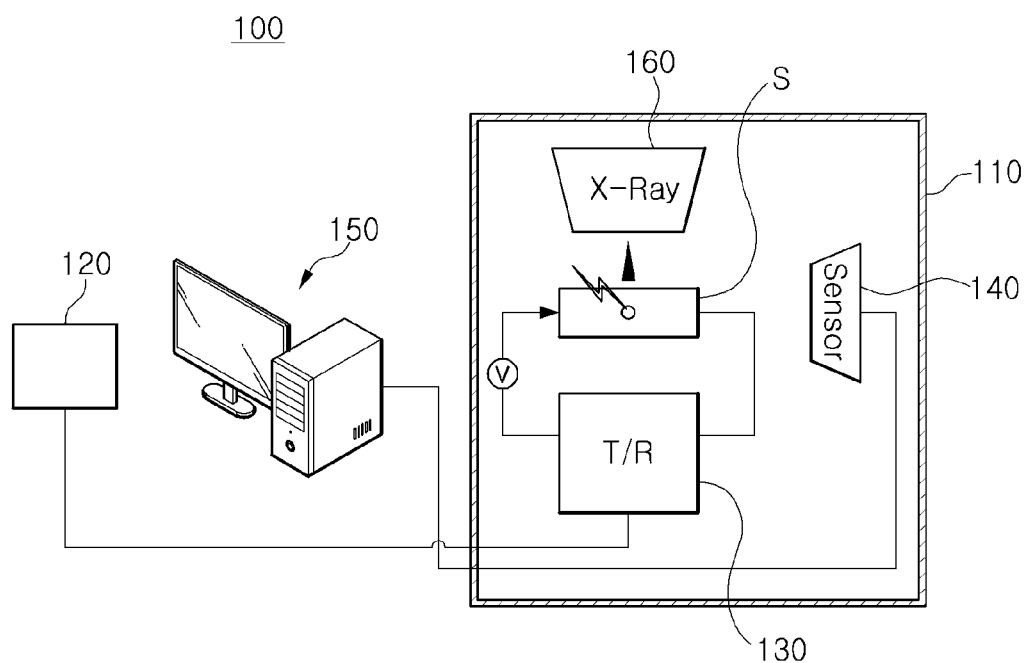
FIG. 1 is a block diagram of a device for detecting a defect in an insulating material according to an embodiment of the present disclosure.

As illustrated in FIG. 1, a device 100 for detecting a defect in an insulating material according to an example embodiment of the present disclosure may include a case 110, a voltage converter 120, a transformer 130, a partial discharge sensor 140, a signal analyzer 150, and an X-ray module 160.

The case 110 may be configured such that the transformer 130, the partial discharge sensor 140, the X-ray module 160, and an insulating material S to be measured may be accommodated therein.

The case 110 may be configured such that the interior of the case 110 is shielded to not radiate an X-ray irradiated from the X-ray module 160 externally, when a defect of the insulating material is measured.

The voltage converter 120 may be provided outside of the case 110, and may convert a voltage applied to the insulating material S.

The transformer 130 may be installed interior of the case 110, and may amplify or reduce a magnitude of the voltage applied to the insulating material S by the voltage converter 120.

The partial discharge sensor 140 may be installed interior of the case 110, and may measure a partial discharge signal generated from the insulating material S.

The signal analyzer 150 may be provided outside of the case 110, and may be connected to the partial discharge sensor 140, to analyze a period and intensity of the partial discharge signal measured by the partial discharge sensor 140, and to display them to confirm by a user.

The X-ray module 160 may be installed interior of the case 110, and may irradiate the insulating material S with an X-ray. The X-ray module 160 may be also configured to allow the user to control an output of the emitting X-ray. In an embodiment, the X-ray module 160 may regulate the output of the emitting X-ray, depending on a voltage and current supplied thereto.

A device 100 for detecting a defect in an insulating material according to an embodiment of the present disclosure may irradiate an X-ray through the X-ray module 160 to an insulating material S to be measured, when the device detects a defect of the insulating material S by applying a voltage to the insulating material S to determine whether a partial discharge is generated.

When the X-ray is irradiated on the insulating material S, ionization of gas existing in voids inside the insulating material S, and electron avalanche may be artificially induced. Therefore, since the gas may be rapidly ionized, there may be advantages that problem relating to discharge delay may not occur, and partial discharge signals may be measured even at a low applied voltage.

Figure 2:
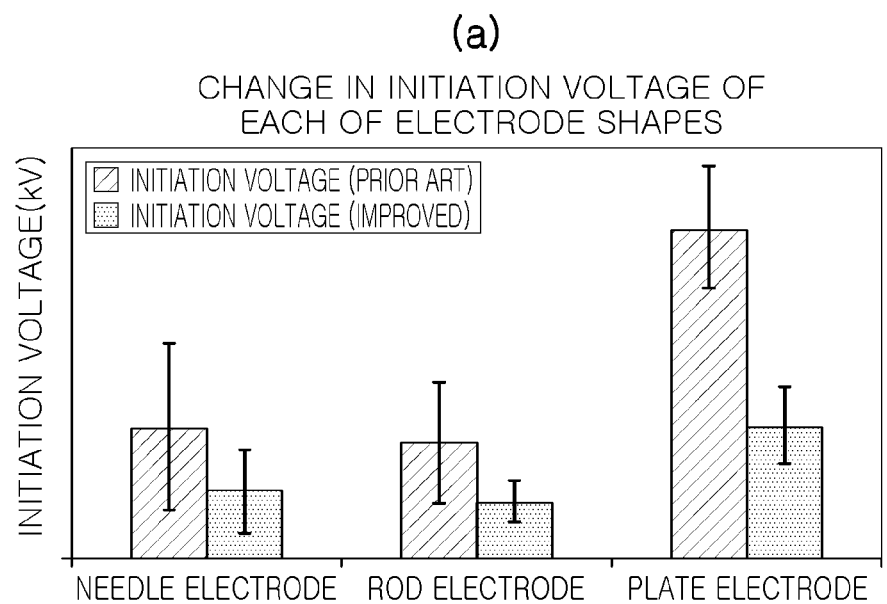
In FIG. 2, (a) is a table for comparing a device for measuring partial discharge in an insulating material disclosed in the related prior art with a device for detecting a defect in an insulating material according to the embodiment of the present disclosure, in view of a magnitude of an initiation voltage of each of the electrode shapes; and (b) is a table for comparing a device for measuring partial discharge in an insulating material disclosed in the related prior art with a device for detecting a defect in an insulating material according to the embodiment of the present disclosure, in view of a magnitude of an extinction voltage of each of the electrode shapes.
Figure 2:
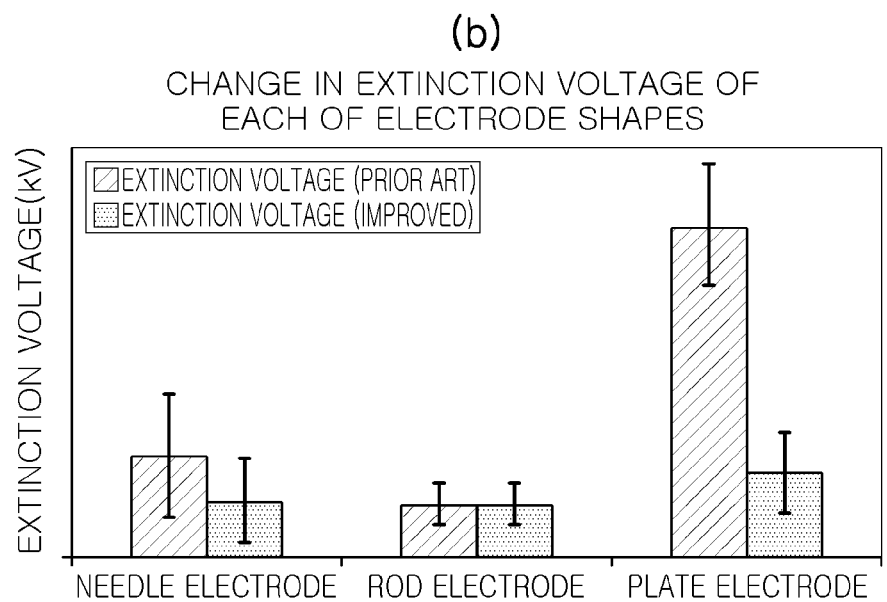

In FIG. 2, (a) and (b) illustrate tables for comparing the device for detecting a defect in an insulating material disclosed in the related prior art, to which no X-ray is applied, with a device 100 for detecting a defect in an insulating material to be measured according to the embodiment of the present disclosure, in view of magnitudes of starting and extinction voltages of each of the electrode shapes, respectively.

In this case, as a shape of an electrode coupled to the insulating material S, a needle electrode, a rod electrode, and a plate electrode were used.

Further, in this case, the initiation voltage refers to a magnitude of a voltage applied to an insulating material S at the time at which a partial discharge is detected for the first time, and the extinction voltage refers to a magnitude of a voltage applied to an insulating material S at the time at which a partial discharge is extinguished again, after detecting a partial discharge.

First, referring to (a) in FIG. 2, when a device 100 for detecting a defect in an insulating material to be measured according to an embodiment of the present disclosure is used, it can be seen that a magnitude of a initiation voltage decreased less than 50% for each electrode shape, as compared with a case in which the conventional device is used.

Such a decrease in the initiation voltage refers to a defect in the insulating material S being detected under a relatively low applied voltage condition.

It can be seen from these experimental results that the device 100 according to an embodiment of the present disclosure may consume less power than the conventional device, to measure a defect in the insulating material S. For example, in the device 100 according to an embodiment of the present disclosure, as described above, the X-ray may artificially ionize gas existing in voids in the insulating material S, to generate a partial discharge even at a relatively low applied voltage.

Further, referring to (b) in FIG. 2, when a device 100 for detecting a defect in an insulating material to be measured according to an embodiment of the present disclosure is used, it can be seen that a magnitude of a extinction voltage decreased less than 50% for needle and plate electrodes, as compared with a case in which the conventional device is used.

Specifically, it can be seen that the magnitude of the extinction voltage decreased by about 45% in the case of the needle electrode, and the magnitude of the extinction voltage in the case of the plate electrode decreased by about 75% or more.

Such a decrease in the extinction voltage refers to the fact that accuracy of predicting insulation performance of the insulating material S is improved. For example, the extinction voltage refers to a maximum limit value of a voltage at which the insulating material S exhibits insulation performance without causing any partial discharge. Therefore, insulation performance of the insulating material S may be more accurately predicted by the device 100 according to an embodiment of the present disclosure, relative to the conventional device.

Figure 3:
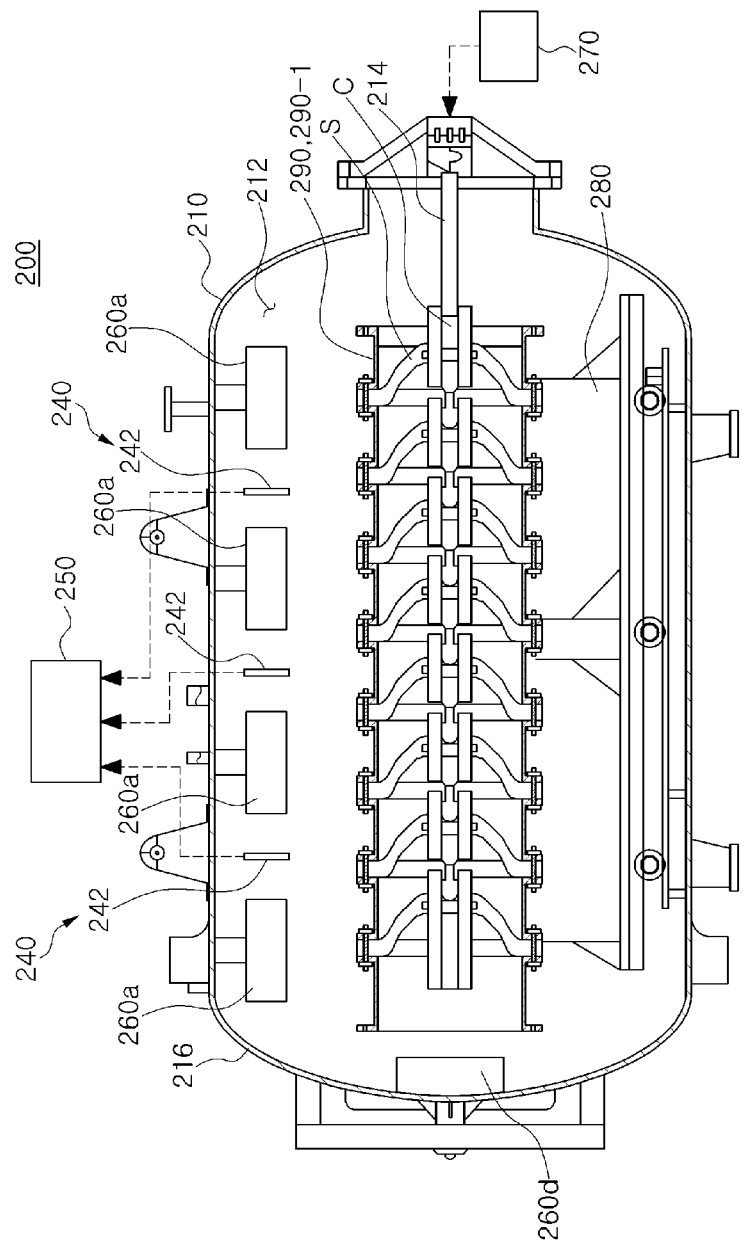
FIG. 3 is a side cross-sectional view of a device for detecting a defect in an insulating material according to another embodiment of the present disclosure.
Figure 4:
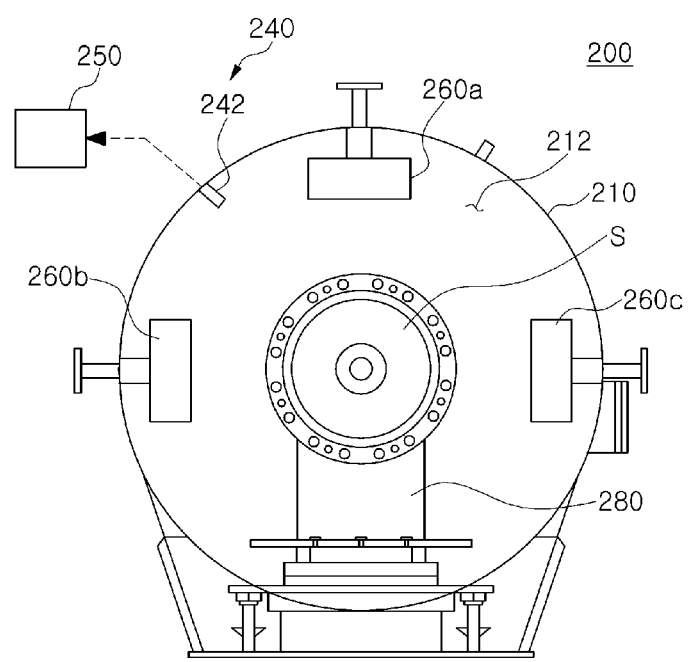
FIG. 4 is a front cross-sectional view of the device illustrated in FIG. 3.
Figure 5:
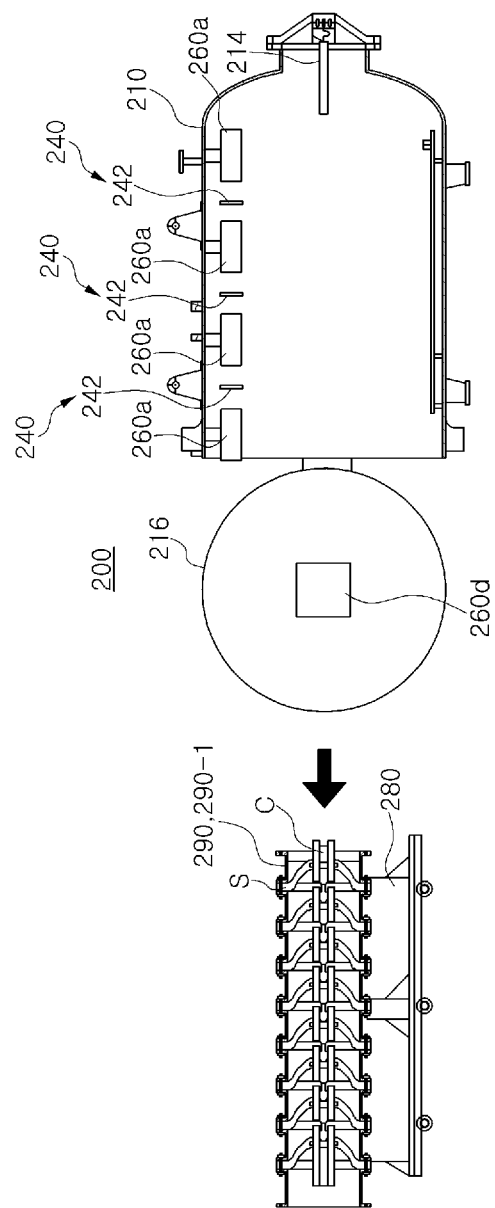
FIG. 5 is a side cross-sectional view of which the insulating material to be measured is withdrawn from the case of the device illustrated in FIG. 3.

FIGS. 3 to 5 illustrate a device 200 for detecting a defect in an insulating material according to another embodiment of the present disclosure.

Hereinafter, a device 200 for detecting a defect in an insulating material according to another embodiment of the present disclosure will be described with reference to FIGS. 3 to 5.

Referring to FIGS. 3 to 5, a device 200 for detecting a defect in an insulating material according to another embodiment of the present disclosure may include a case 210, a withstand voltage tester 270, a plurality of X-ray modules 260, a partial discharge sensor 240, a signal analyzer 250, a cradle 280, and jigs 290 and 290-1.

The case 210 may include a test chamber 212 in which an insulating material S to be measured is accommodated. Such a case 210 may be configured to shield the test chamber 212 such that an X-ray irradiated from the X-ray module 260 is not radiated externally, when a defect of the insulating material S is measured.

In an embodiment, one side of the case 210 may be provided with a door 216 for opening and closing the test chamber 212. A plurality of insulating materials S to be measured, to be described later, may be inserted into and withdrawn from the test chamber 212 through the door 216, while being mounted on the cradle 280.

Also, in an embodiment, the case 210 may include a conductor C protruded into the test chamber 212 and coupled to the plurality of insulating materials S, and an electrode terminal 214 connected to the withstand voltage tester 270 and supplying a voltage generated by the withstand voltage tester 270 to the conductor C.

Further, in an embodiment, the case 210 may be configured to simultaneously accommodate the plurality of insulating materials S in the test chamber 212. For this purpose, the case 210 may be formed in a cylindrical shape elongated in a horizontal direction as illustrated in FIG. 3, but is not limited thereto. The plurality of insulating materials S may be housed in a row, and may use any shape thereof as long as the shape satisfies withstand voltage performance against internal explosion by a relatively high voltage.

The withstand voltage tester 270 may be provided outside of the case 210, and may apply a relatively high voltage to the insulating material S accommodated in the test chamber 212. The withstand voltage tester 270 may control a magnitude of a voltage applied to the insulating material S.

The plurality of X-ray modules 260 may be disposed interior of the test chamber 212, and may irradiate an X-ray toward different regions or in different directions, respectively. For example, each of the plurality of X-ray modules 260 may irradiate an X-ray in different directions, or irradiate an X-ray toward different regions even in the same direction.

In this case, the X-ray module 260 may be configured to allow the user to control an output of an emitting X-ray. In one example, the X-ray module 260 may control an output of an emitting X-ray, depending on a voltage and current supplied thereto.

The plurality of X-ray modules 260 may operate independently of each other. For example, power source may be selectively applied to each of the plurality of X-ray modules 260 to diversify an X-ray irradiation region.

In an embodiment, the plurality of X-ray modules 260 may include a plurality of upper X-ray modules 260a, a plurality of leftward X-ray modules 260b, a plurality of rightward X-ray modules 260c, and a front X-ray module 260d, as illustrated in FIGS. 3 and 4.

In this case, the plurality of upper X-ray modules 260a may be arranged in an upper portion of the test chamber 212 in a longitudinal direction of the case 210, and may irradiate X-rays in a downward direction.

The plurality of leftward X-ray modules 260b may be arranged on a left side of the test chamber 212 in a longitudinal direction of the case 210, and may irradiate X-rays rightwardly.

The plurality of rightward X-ray modules 260c may be arranged on a right side of the test chamber 212 in a longitudinal direction of the case 210, and may irradiate X-rays leftwardly.

The plurality of rightward X-ray modules 260c may be arranged on a right side of the test chamber 212 in a longitudinal direction of the case 210, and may irradiate X-rays leftwardly.

The front X-ray module 260d may be provided in a front portion of the test chamber 212, and may irradiate X-rays in a rear direction of the test chamber 212.

A configuration of each X-ray module 260 constituting the plurality of upper X-ray modules 260a, the plurality of leftward X-ray modules 260b, and the plurality of rightward X-ray modules 260c may be variously set, depending on test conditions of the device and the insulating material S. For example, the plurality of leftward X-ray modules 260b and the plurality of rightward X-ray modules 260c may be arranged such that each of the respective modules faces each other, or each of the respective modules intersects with respect to each other, on the basis of the arrangement direction.

There are advantages that the device 200 according to an embodiment of the present disclosure having such a configuration may irradiate X-rays to the plurality of insulating materials S at the same time, by the plurality of X-ray modules 260 for irradiating X-rays toward different regions and in various directions, and a dead zone in which the X-rays are not irradiated may not occur.

In addition, there are advantages that since the device 200 according to an embodiment of the present disclosure may radiate X-rays in different directions to the insulating material S, the device 200 may be configured to allow a relatively high energy X-ray to reach a central portion of an insulating material S having a relatively wide, thick, and/or long dimension(s). When the relatively high energy X-ray reaches the entire region of the insulating material S, a gas ionization rate may increase, thereby shortening the partial discharge detection time.

In a case of testing an insulating material S having a relatively narrow, thin, and/or short dimension(s), power consumption may be reduced by selectively operating a portion of the plurality of X-ray modules 260 irradiating X-rays in the same region in different directions.

In an embodiment, the X-ray module 260 may be configured to control a distance between the X-ray module 260 and the insulating material S accommodated in the test chamber 212. Therefore, accuracy of the defect detection test may be improved by disposing the X-ray module 260 at an appropriate position, depending on a size of the insulating material S. Although not illustrated in detail, the X-ray module 260 may control a distance between the X-ray module 260 and the insulating material S by a variable-length support mechanism (not illustrated) supporting the X-ray module 260 on an inner wall of the case 210.

Also, although not illustrated, the X-ray module 260 may be configured to have a tilting function, such that an irradiation angle may be controlled and may be moved by a preset distance in the longitudinal direction of the case 210.

The partial discharge sensor 240 may measure a partial discharge generated in the insulating material S accommodated in the test chamber 212.

For example, the partial discharge sensor 240 may be configured to have a high frequency current transformer (HFCT) sensor (not illustrated) connected to a ground line connected to each of the plurality of insulating materials S. When the partial discharge sensor 240 has the HFCT sensor, it is possible to detect whether or not each of the insulating materials S is defective.

In addition, in another example, the partial discharge sensor 240 may be configured to have a UHF antenna 242 installed in the case 210. When the partial discharge sensor 240 has the UHF antenna 242 installed in the case 210, it is possible to detect, at a time, whether or not the entire of the plurality of insulating materials S, accommodated in the test chamber 212 at the same time, and detected at once, are defective.

The partial discharge sensor 240 is not limited to the HFCT sensor and the UHF antenna 242 described above, and may be configured by various types of sensors capable of detecting a partial discharge generated in the insulating material S.

The signal analyzer 250 may be provided outside of the case 210, and may be connected to the partial discharge sensor 240, to analyze a period and intensity of the partial discharge signal measured by the partial discharge sensor 240, and to display them to confirm by a user.

The cradle 280 may be configured in a form of a tray in which the plurality of insulating materials S may be mounted, and inserted into and withdrawn from the test chamber 212. As illustrated in FIG. 5, the user may withdraw the cradle 280 from the case 210 externally, may mount the plurality of insulating materials S on the cradle 280 externally, and may accommodate them in the test chamber 212 at a time.

In an embodiment, a device 200 for detecting a defect in an insulating material according to another embodiment of the present disclosure may be configured to inspect a defect in a disc-shaped insulating disc as illustrated in FIGS. 3 to 5. In this case, the jig 290 may be formed in a cylindrical shape as a whole, to be coupled to a flange formed on an edge of the disc-shaped insulating disc, but is not limited thereto.

Next, a method for detecting a defect in an insulating material according to an embodiment of the present disclosure will be described.

First, as illustrated in FIG. 1, an insulating material S to be measured may be mounted on a jig or frame structure installed interior of the case 110.

Thereafter, a voltage may be applied to the electrode connected to the insulating material S, and the X-ray module 160 may be operated to irradiate the insulating material S with X-rays.

Then, a magnitude of the voltage applied to the electrode may increase, until a partial discharge signal is detected by the partial discharge sensor 140.

An output of the X-ray module 160 may be controlled to minimize a noise signal generated in the X-ray module 160 and received by the partial discharge sensor 140. In this case, the output of the X-ray module 160 may be controlled to avoid or minimize interference with the partial discharge signal generated in the insulating material S.

When the partial discharge sensor 140 detects the partial discharge signal, an initiation voltage may be measured.

Then, after the initiation voltage is measured, the partial discharge sensor 140 may reduce a voltage applied to the electrode, until the partial discharge signal is extinguished.

Then, an extinction voltage at the time of the extinction of the partial discharge signal may be measured.

Finally, based on the measured partial discharge signal, the initiation voltage, and the extinction voltage, it may be determined whether or not the insulating material S is defective, and the insulation performance of the insulating material S.

As described above, a method for detecting a defect in an insulating material according to an embodiment of the present disclosure may have an advantage that the partial discharge signal may be measured at a relatively low applied voltage by occurrence of electron avalanche due to rapid ionization of a gas existing in voids formed in the insulating material S by X-rays. Therefore, a defect in the insulating material S may be rapidly detected, and potential damage caused by applying a relatively high voltage to the insulating material S in the performance testing operation may be minimized to improve the product life span and the product reliability.

In addition, a method for detecting a defect in an insulating material according to the present disclosure may measure a cross-sectional area and a thickness of the insulating material, based on a direction in which the X-ray is irradiated to the insulating material; and control an applied voltage and an applied current to an X-ray generating unit (for example, an X-ray tube) of the X-ray module, depending on the cross-sectional area and the thickness of the measured insulating material.

In this case, the X-ray is characterized in that transmittance may be proportional to the applied voltage, and density may be proportional to the applied current.

Therefore, in a method for detecting a defect in an insulating material according to an embodiment of the present disclosure, a degree to which a material property of an insulating material (for example, epoxy) is deteriorated may be minimized by optimizing the output of the X-ray irradiated on the insulating material using the transmittance and density characteristics, depending on the applied voltage and the applied current of the X-ray.

For reference, when the output of the X-ray irradiated on an insulating material is excessive, the excessive energy of the X-ray affects material properties of the insulating material to deteriorate the material properties of the insulating material. In addition, when an insulating material whose material properties deteriorate is applied to a product, the performance of the product deteriorates.

A method for detecting a defect in an insulating material S according to an embodiment of the present disclosure may be divided into a case in which a spacing distance between an X-ray generating unit of an X-ray module and an insulating material to be measured is constant, and a case in which a spacing distance between an X-ray generating unit of an X-ray module and an insulating material to be measured is varied.

First, a condition in which the spacing distance is constant will be described.

A cross-sectional area and thickness of an insulating material S to be measured may be measured.

An applied voltage may be controlled to control transmittance of an X-ray, depending on a thickness of an insulating material to be measured, and an applied current may be controlled to control density of an X-ray, depending on a cross-sectional area of an insulating material to be measured.

Specifically, in the applied voltage controlling operation, the thickness of the insulating material may be compared with a preset reference thickness.

When the thickness of the insulating material is equal to or greater than the reference thickness, the applied voltage may be set as a high voltage. Further, when the thickness of the insulating material is less than the reference thickness, the applied voltage may be set as a medium level voltage or a low voltage. In this case, the voltage value may be high in the order of the high voltage, the medium level voltage, and the low voltage, and the high voltage, the medium level voltage, and the low voltage may be preset.

In the applied current controlling operation, the cross-sectional area of the insulating material may be compared with a preset reference area.

Then, when the cross-sectional area of the insulating material is equal to or greater than a preset reference area, the applied current may be set as a large current. Further, when the cross-sectional area of the insulating material is smaller than the reference area, the applied current may be set as a intermediate current or a small current. In this case, the current values may be high in the order of the large current, the intermediate current, and the small current, and the large current, the intermediate current, and the small current may be preset.

Next, a condition in which the spacing distance is varied will be described.

The X-ray is characterized in that attenuation may be generated, depending on a distance from a material to be irradiated. In addition, a case in which the distance from the material is relatively short, properties of the material may be affected, since energy of the X-ray applied to the material may be relatively high even when the X-ray is output with a relatively low energy.

Therefore, the method according to an embodiment of the present disclosure may minimize a problem that measurement accuracy due to the attenuation of the X-ray is deteriorated or the material properties of the insulating material due to the excessive energy of the X-ray is deteriorated, even when shapes of the insulating materials to be measured are the same, by controlling the applied voltage and the applied current, depending on the distance between the X-ray generating unit and the insulating material.

First, the cross-sectional area and thickness of the insulating material may be measured.

Then, the spacing distance between the insulating material and the X-ray generating unit may be measured.

Thereafter, the thickness of the insulating material and the reference thickness may be compared, and the cross-sectional area of the insulating material and the reference area may be compared.

Then, the applied voltage and the applied current may be set, depending on the thickness, the cross-sectional area, and the spacing distance of the insulating material, to control the output of the X-ray.

First, when the thickness of the insulating material to be measured is equal to or greater than the reference thickness, and the cross-sectional area is equal to or greater than the reference area, the spacing distance and the preset reference distance may be compared.

The applied voltage and the applied current may be set, depending on the spacing distance.

Specifically, when the spacing distance is less than the reference distance, the applied voltage may be set as a medium level voltage, and the applied current may be set as a intermediate current, so as to determine the spacing distance as a short distance, and so as to prevent excessive supply of X-ray energy.

When the spacing distance is equal to the reference distance, the applied voltage may be set as a medium level voltage or a high voltage, and the applied current may be set as a large current, by determining the spacing distance as a middle distance.

In addition, when the spacing distance exceeds the reference distance, the applied voltage may be set as a high voltage, and the applied current may be set as a large current, so as to compensate the attenuation of the X-ray, by determining the spacing distance as a long distance.

Next, when the thickness of the insulating material is equal to or greater than the reference thickness and the cross-sectional area of the insulating material is equal to or greater than the reference area, the spacing distance and the preset reference distance may be compared.

The applied voltage and the applied current may be set, depending on the spacing distance.

Specifically, when the spacing distance is less than the reference distance, the applied voltage may be set as a medium level voltage, and the applied current may be set as a small current, so as to determine the spacing distance as a short distance, and so as to prevent excessive supply of X-ray energy.

When the spacing distance is equal to the reference distance, the applied voltage may be set as a medium level voltage or a high voltage, and the applied current may be set as a small current or a intermediate current, by determining the spacing distance as a middle distance.

In addition, when the spacing distance exceeds the reference distance, the applied voltage may be set as a high voltage, and the applied current may be set as a large current, so as to compensate the attenuation of the X-ray, by determining the spacing distance as a long distance.

Next, when the thickness of the insulating material is less than the reference thickness and the cross-sectional area of the insulating material is less than the reference area, the spacing distance and the preset reference distance may be compared.

The applied voltage and the applied current may be set, depending on the spacing distance.

Specifically, when the spacing distance is less than the reference distance, the applied voltage may be set as a low voltage, and the applied current may be set as a small current, so as to determine the spacing distance as a short distance, and so as to prevent excessive supply of X-ray energy.

When the spacing distance is equal to the reference distance, the applied voltage may be set as a medium level voltage, and the applied current may be set as a small current or an intermediate current, by determining the spacing distance as a middle distance.

In addition, when the spacing distance exceeds the reference distance, the applied voltage may be set as a medium level voltage, and the applied current may be set as a intermediate current or a large current, so as to compensate the attenuation of the X-ray, by determining the spacing distance as a long distance.

Finally, when the thickness of the insulating material is less than the reference thickness and the cross-sectional area of the insulating material is less than the reference area, the spacing distance and the preset reference distance may be compared.

Then, the applied voltage and the applied current may be set, depending on the spacing distance (S164).

Specifically, when the spacing distance is less than the reference distance, the applied voltage may be set as a low voltage, and the applied current may be set as a intermediate current, so as to determine the spacing distance as a short distance, and so as to prevent excessive supply of X-ray energy.

When the spacing distance is equal to the reference distance, the applied voltage may be set as a low voltage or a medium level voltage, and the applied current may be set as a large current, by determining the spacing distance as a middle distance.

In addition, when the spacing distance exceeds the reference distance, the applied voltage may be set as a high voltage, and the applied current may be set as a large current, so as to compensate the attenuation of the X-ray, by determining the spacing distance as a long distance.

In an embodiment of the present disclosure, the spacing distance may be set as 500 mm to 800 mm, but is not limited thereto, and may be set in a different manner, depending on the performance of the X-ray module and the material of the insulating material.

As illustrated in FIG. 3, a method for detecting a defect in an insulating material according to an example embodiment of the present disclosure may detect a defect in an insulating material using a device 200 including a plurality of X-ray modules 260 irradiating an X-ray toward different regions or in different directions on an insulating material S to be measured in the case 210, and, in this case, the number of the plurality of X-ray modules to be operated may be controlled, depending on a cross-sectional area and thickness of the insulating material, and a spacing distance.

Figure 6:
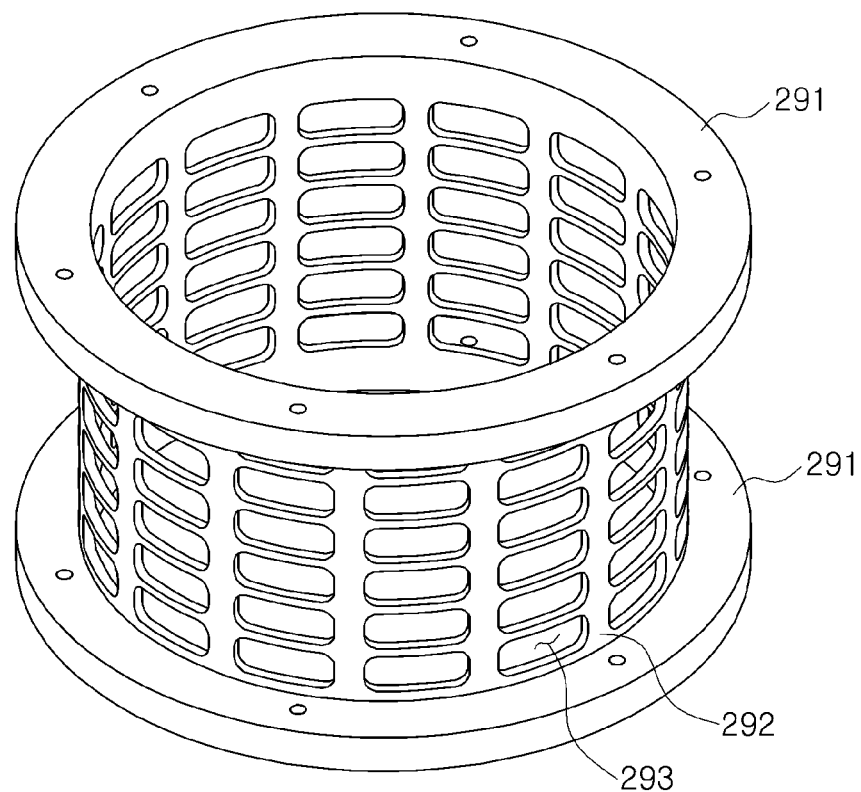
FIG. 6 is a perspective view of a jig for fixing an insulating material to be measured, in a device for detecting a defect in the insulating material, according to a first embodiment of the present disclosure.
Figure 7:
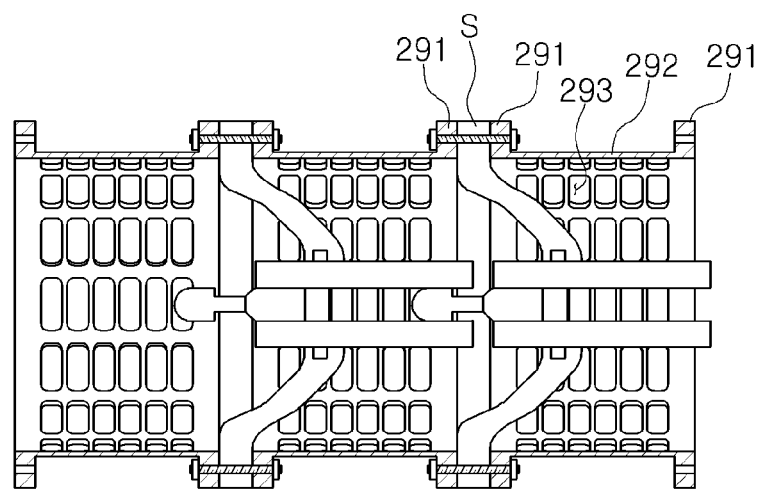
FIG. 7 is a side cross-sectional view illustrating a structure for fixing the insulating material with the jig illustrated in FIG. 6.
Figure 8:
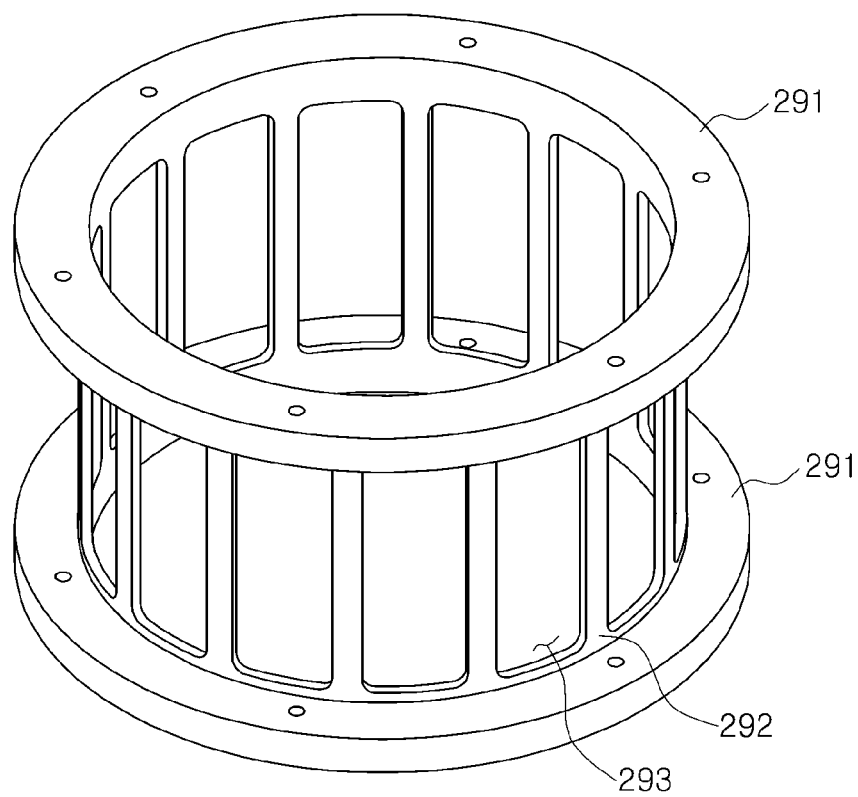
FIG. 8 is a perspective view of a jig for fixing an insulating material to be measured, in a device for detecting a defect in the insulating material, according to a second embodiment of the present disclosure.
Figure 9:
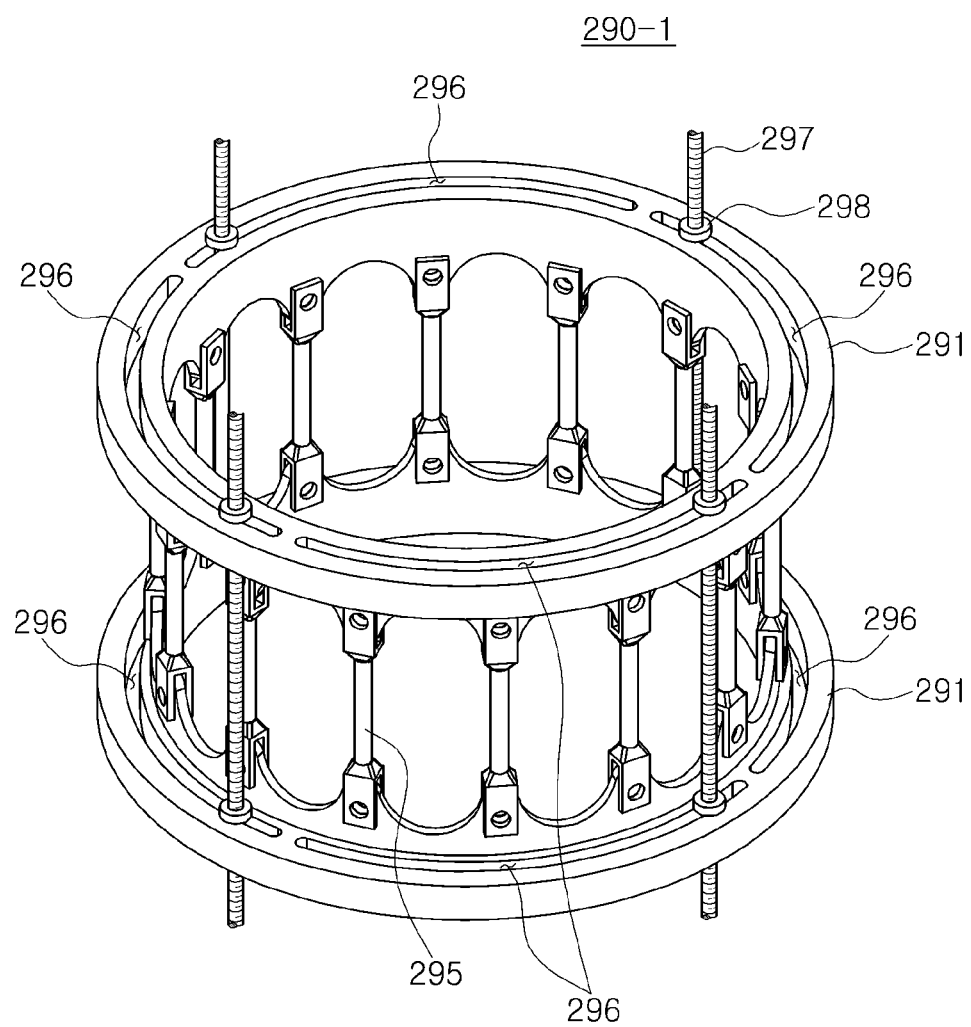
FIG. 9 is a perspective view of a jig for fixing an insulating material to be measured, in a device for detecting a defect in the insulating material, according to a third embodiment of the present disclosure.
Figure 10:
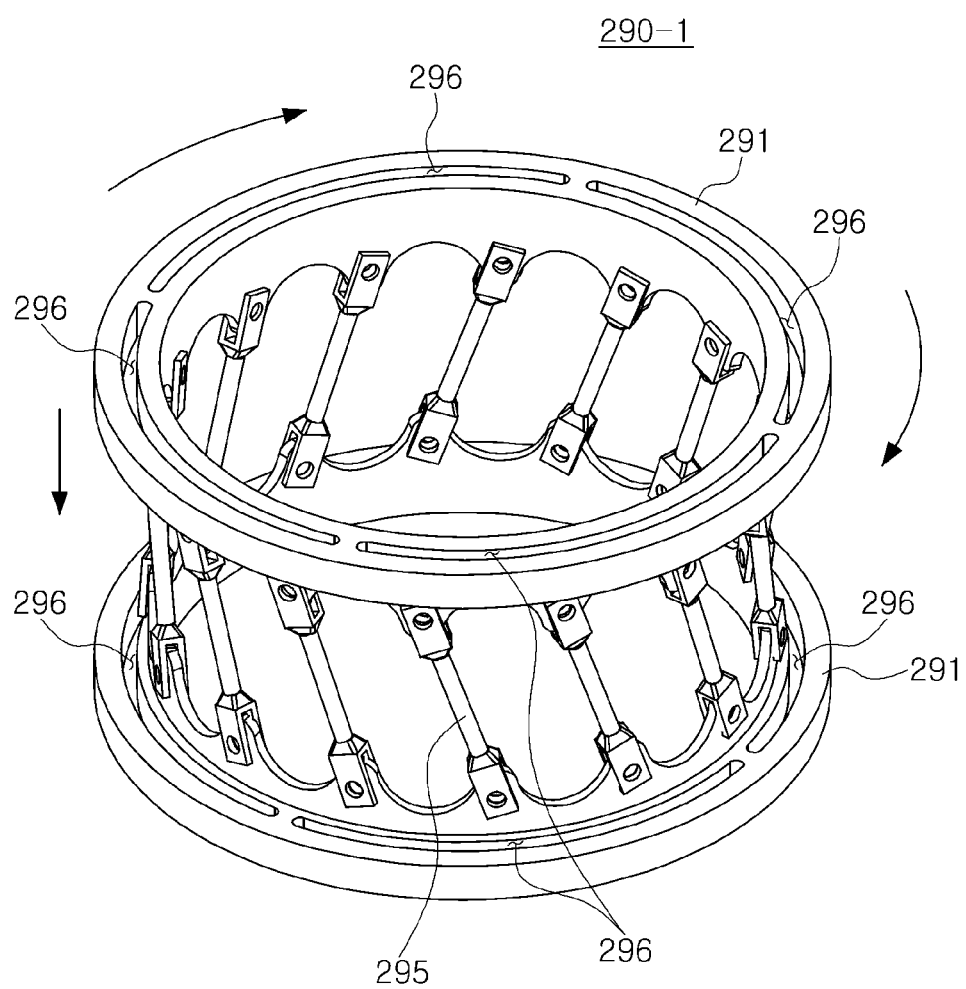
FIG. 10 is an operational state diagram of the jig illustrated in FIG. 9.
Figure 11:
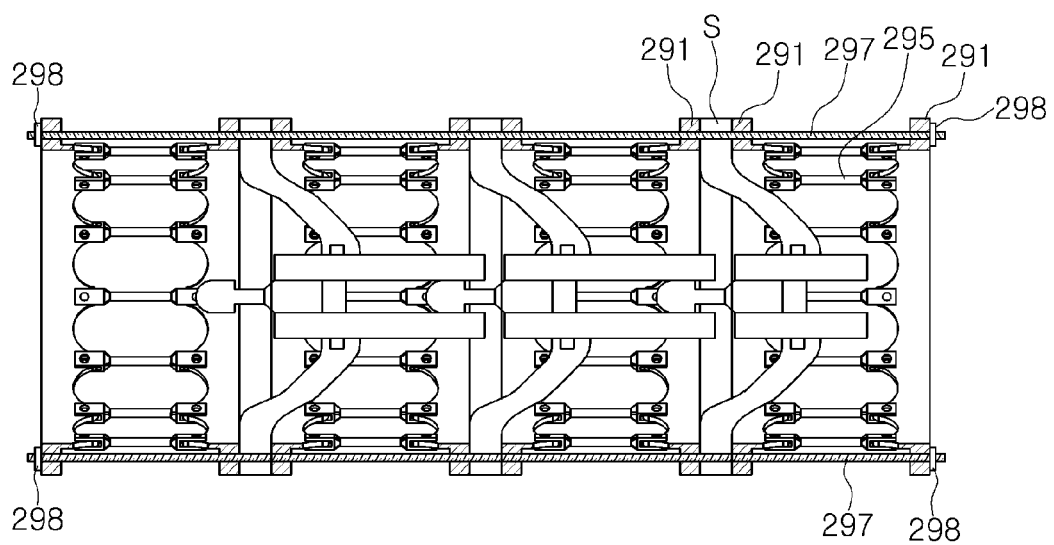
FIG. 11 is a side cross-sectional view illustrating a structure for fixing the insulating material by the jig illustrated in FIG. 9.

FIGS. 6 and 7 illustrate Example 1 of a jig 290 (hereinafter referred to as "jig") for fixing an insulating material S to be measured in a device for detecting a defect in an insulating material, FIG. 8 illustrates Example 2, and FIGS. 9 to 11 illustrate Example 3.

As illustrated in FIGS. 6 and 7, a jig 290 according to Example 1 may include a flange portion 291, a support pipe 292, and a through-hole 293.

The flange portion 291 may be formed as a pair, and may be fastened to flanges formed in end portions of an insulating material S to be measured.

The flange portions 291 may be bolted and coupled to the flanges of the insulating material S, as illustrated in FIG. 7.

The support pipe 292 may connect the pair of flange portions 291 to each other, and may support the pair of flange portions 291 to be spaced apart from each other. For example, each of the flange portion 291 may be formed at each end of the support pipe 292.

The support pipe 292 may be formed in a cylindrical shape surrounding the remaining portions of the insulated body, except for the flange of the insulating material S.

The through-holes 293 may be openings formed through a body of the support pipe 292, and may be formed, in plural, over the entire area of the support pipe 292.

The through-holes 293 may reduce the energy attenuation of the X-ray by the support pipe 292, and may minimize the occurrence of dead zone in which the X-ray energy does not reach the insulating material S.

For example, in the insulating material S coupled to the jig 290, the remaining portions of the insulated body may be covered by the support pipe 292, and since the support pipe 292 may be made of a metal material, the energy of the X-ray to be irradiated to the insulating material S may be attenuated by the support pipe 292, and a dead zone in which the X-ray energy does not reach the insulating material S may occur. The through-hole 293 may pass through the support pipe 292 to minimize the energy attenuation of the X-ray.

As illustrated in FIG. 6, the through-hole 293 may be formed in plural at an interval in a circumferential direction of the flange portion 291, and may be formed in a plurality of openings in a longitudinal direction of the support pipe 292.

A flange portion 291 and a support pipe 292 in a jig 290 according to Example 2 illustrated in FIG. 8 may be substantially identical to the flange portion 291 of Example 1 and the support pipe 292 of Example 1, respectively, and a shape of the through-hole 293 in a jig 290 according to Example 2 illustrated in FIG. 8 may be different from a shape of the through-hole 293 formed in the jig 290 of Example 1.

The through-hole 293 in Example 2 may be formed in plural at an interval in the circumferential direction of the flange portion 291, but may be formed to extend in an elongated form in the longitudinal direction of the support pipe 292.

Finally, referring to FIGS. 9 to 11, Example 3 of a jig 290-1 will be described.

As illustrated in FIGS. 9 to 11, a jig 290-1 according to Example 3 may include a support rod 295, instead of the support pipe 292, as an element connecting a pair of flange portions 291.

The support rod 295 may be connected to the pair of flange portions 291, and may support the pair of flange portions 291 to be spaced apart from each other. Both ends of the support rod 295 may be rotatably coupled to the flange portions 291 in a circumferential direction of the flange portions 291. Further, the plurality of support rods 295 may be provided at intervals with each other in the circumferential direction of the flange portions 291. Therefore, the interval between the support rod 295 and the support rod 295 allows the X-ray to reach the insulating material S without energy attenuation.

In this configuration, when one flange portion 291 among the pair of flange portions 291 is formed to be in the circumferential direction with respect to the other flange portion 291, the support rods 295 rotatably coupled to the flange portions 291, as illustrated in FIG. 10, may be allowed to rotate in the circumferential direction of the flange portion 291, and the plurality of support rods 295 may be inclined in a direction in which the flange portions 291 are rotated. As a result, the interval of the pair of flange portions 291 may be changed.

Therefore, a distance of the jig 290-1 according to Example 3 may be controlled, depending on a rotation angle of the flange portion 291.

The jig 290-1 according to Example 3 may control the number of the insulating materials S simultaneously accommodated in a test chamber 212 by the distance control.

Each of the pair of flange portions may form a plurality of elongated holes 296 passing through in a direction in which the flange of the insulating material is fastened, and extending in the circumferential direction of each of the pair of flange portions.

The jig 290-1 may further include a stud bolt 297 and a nut 298.

As illustrated in FIG. 9, the stud bolt 297 may be passed through and fastened to each of the elongated holes 296, and may be fastened to the flange of the insulating material S.

The nut 298 may be screwed to the stud bolt 297, to fix the stud bolt 297, passed through and fastened to each of the elongated holes 296, to the flange portions 291.

In this configuration, the stud bolts 297 may be fixed to the pair of flange portions 291, through the elongated holes 296 elongated in the circumferential direction of the flange portion 291, even when the flange portion 291 is rotated at any angle.

As illustrated in FIG. 11, when a plurality of jigs 290-1 according to Example 3 fix a plurality of insulating materials S to be measured, a stud bolt 297 having a long length that collectively passes through flange portions 291 of the plurality of jigs 290-1 and a plurality of flanges of the insulating material S, may be used from the jig 290-1 disposed at the foremost position to the jig 290-1 disposed at the rearmost position. In this case, the nut 298 may be excluded at portions in which the flange portion 291 and the flange of the insulating material S are in contact with each other.

While example embodiments have been illustrated and described above, it will be apparent to those skilled in the art that modifications and variations could be made without departing from the scope of the present disclosure as defined by the appended claims.

The invention claimed is:

1. A method for detecting a defect in an insulating material to be measured by irradiating an X-ray to the insulating material, using an X-ray module, to induce a gas ionization of voids existing in the insulating material, and measuring a partial discharge generated in the insulating material, comprising:
a cross-sectional area and thickness measuring operation of measuring a cross-sectional area and a thickness of the insulating material, based on a direction in which the X-ray is irradiated to the insulating material; and
an X-ray output controlling operation of controlling an applied voltage and an applied current to an X-ray generating unit of the X-ray module, depending on the cross-sectional area and the thickness of the insulating material;

wherein the X-ray output controlling operation comprises:

an applied voltage controlling operation of controlling the applied voltage, depending on the thickness of the insulating material; and an applied current controlling operation of controlling the applied current, depending on the cross-sectional area of the insulating material;

wherein the applied voltage controlling operation comprises an operation of comparing a thickness of the insulating material with a preset reference thickness, setting the applied voltage as a preset high voltage, when the thickness of the insulating material is equal to or greater than the preset reference thickness, and setting the applied voltage as a preset medium level voltage, lower than the preset high voltage, or as a preset low voltage, lower than the preset medium level voltage, when a thickness of the insulating material is less than the preset reference thickness.

2. The method according to claim 1, wherein the applied current controlling operation comprises an operation of comparing a cross-sectional area of the insulating material with a preset reference area, setting the applied current as a preset large current, when the cross-sectional area of the insulating material is equal to or greater than the preset reference area, and setting the applied current as a preset intermediate current, lower than the preset large current, or as a preset small current, lower than the preset intermediate current, when a cross-sectional area of the insulating material is smaller than the preset reference area;

further comprising an operation of measuring a spacing distance between the insulating material and the X-ray generating unit, after the cross-sectional area and thickness measuring operation, wherein the X-ray output controlling operation comprises an operation of controlling an applied voltage and an applied current to the X-ray generating unit, depending on the spacing distance;

wherein the X-ray output controlling operation further comprises an operation of comparing the spacing distance with a preset reference distance, when a thickness of the insulating material is compared with a preset reference thickness, a cross-sectional area of the insulating material is compared with a preset reference area, the thickness of the insulating material is equal to or greater than the preset reference thickness, and the cross-sectional area of the insulating material is equal to or greater than the preset reference area, wherein, the applied voltage is set as a preset medium level voltage, and the applied current is set as a preset intermediate current, when the spacing distance is shorter than the preset reference distance;

the applied voltage is set as the preset medium level voltage, or as a preset high voltage, higher than the preset medium level voltage, and the applied current is set as the preset intermediate current, or as a preset large current, greater than the preset intermediate current, when the spacing distance is equal to the preset reference distance; and the applied voltage is set as the preset high voltage, and the applied current is set as the preset large current, when the spacing distance is longer than the preset reference distance.

3. The method according to claim 2, wherein the X-ray output controlling operation further comprises an operation of comparing the spacing distance with a preset reference distance, when a thickness of the insulating material is compared with a preset reference thickness, a cross-sectional area of the insulating material is compared with a preset reference area, the thickness of the insulating material is equal to or greater than the preset reference thickness, and the cross-sectional area of the insulating material is smaller than the preset reference area, wherein, the applied voltage is set as a preset medium level voltage, and the applied current is set as a preset small current, when the spacing distance is shorter than the preset reference distance;

the applied voltage is set as the preset medium level voltage, or as a preset high voltage, higher than the preset medium level voltage, and the applied current is set as the preset small current, or as a preset intermediate current, greater than the preset small current, when the spacing distance is equal to the preset reference distance; and the applied voltage is set as the preset high voltage, and the applied current is set as the preset large current, greater than the preset intermediate current, when the spacing distance is longer than the preset reference distance;

wherein the X-ray output controlling operation further comprises an operation of comparing the spacing distance with a preset reference distance, when a thickness of the insulating material is compared with a preset reference thickness, a cross-sectional area of the insulating material is compared with a preset reference area, the thickness of the insulating material is less than the preset reference thickness, and the cross-sectional area of the insulating material is smaller than the preset reference area, wherein, the applied voltage is set as a preset low voltage, and the applied current is set as a preset small current, when the spacing distance is shorter than the preset reference distance;

the applied voltage is set as the preset medium level voltage, or as a preset medium level voltage, higher than the preset low voltage, and the applied current is set as the preset small current, or as a preset intermediate current, greater than the preset small current, when the spacing distance is equal to the preset reference distance; and the applied voltage is set as the preset medium level voltage, and the applied current is set as the preset intermediate current, or as a preset large current, greater than the preset intermediate current, when the spacing distance is longer than the preset reference distance;

wherein the X-ray output controlling operation further comprises an operation of comparing the spacing distance with a preset reference distance, when a thickness of the insulating material is compared with a preset reference thickness, a cross-sectional area of the insulating material is compared with a preset reference area, the thickness of the insulating material is less than the preset reference thickness, and the cross-sectional area of the insulating material is equal to or greater than the preset reference area, wherein, the applied voltage is set as a preset low voltage, and the applied current is set as a preset intermediate current, when the spacing distance is shorter than the preset reference distance;

the applied voltage is set as the preset low voltage, or as a preset medium level voltage, higher than the preset low voltage, and the applied current is set as the preset intermediate current, or as a preset large current, greater than the preset intermediate current, when the spacing distance is equal to the preset reference distance; and the applied voltage is set as a preset high voltage, higher than the preset medium level voltage, and the applied current is set as the preset large current, when the spacing distance is longer than the preset reference distance.

4. The method according to claim 3, wherein the spacing distance is set to be 500 mm to 800 mm;

wherein the X-ray module is used, in plural, to irradiate the X-ray to the insulating material, and the number of the plurality of X-ray modules to be operated is controlled, depending on the cross-sectional area and thickness of the insulating material, and the spacing distance.

* * * * *